(12) United States Patent
Seong

(10) Patent No.: US 11,353,974 B2
(45) Date of Patent: Jun. 7, 2022

(54) DISPLAY DEVICE

(71) Applicant: Samsung Display Co., Ltd., Yongin-si (KR)

(72) Inventor: Seok Je Seong, Yongin-si (KR)

(73) Assignee: Samsung Display Co., Ltd.

(*) Notice: Subject to any disclaimer, the term of this patent is extended or adjusted under 35 U.S.C. 154(b) by 19 days.

(21) Appl. No.: 16/858,501

(22) Filed: Apr. 24, 2020

(65) Prior Publication Data
US 2020/0257394 A1 Aug. 13, 2020

Related U.S. Application Data

(63) Continuation of application No. 15/409,339, filed on Jan. 18, 2017, now Pat. No. 10,635,209.

(30) Foreign Application Priority Data

Jan. 20, 2016 (KR) .................. 10-2016-0006914

(51) Int. Cl.
*G06F 3/041* (2006.01)
*H01L 27/32* (2006.01)
(Continued)

(52) U.S. Cl.
CPC .......... *G06F 3/0412* (2013.01); *G06F 3/0445* (2019.05); *H01L 27/323* (2013.01);
(Continued)

(58) Field of Classification Search
CPC ......... G06F 3/0412; G06F 2203/04112; H01L 27/323; H01L 27/3246; H01L 51/525;
(Continued)

(56) References Cited

U.S. PATENT DOCUMENTS 9,147,721 B2 9/2015 Hong
9,360,971 B2 6/2016 Barton et al.
(Continued)

FOREIGN PATENT DOCUMENTS

CN 101788875 A 7/2010
CN 102103426 A 6/2011
(Continued)

OTHER PUBLICATIONS

Chinese Communication corresponding to Chinese Patent Application No. 201710050174.2 dated Nov. 12, 2020 8 pages.
(Continued)

*Primary Examiner* — Amr A Awad
*Assistant Examiner* — Aaron Midkiff
(74) *Attorney, Agent, or Firm* — Innovation Counsel LLP

(57) ABSTRACT

A display device includes a first substrate, a second substrate, a transistor, a display element, a first touch electrode, a second touch electrode, a spacer, and a light reflector. The second substrate overlaps the first substrate. The transistor is positioned between the first substrate and the second substrate. The display element is electrically connected to the transistor. The first touch electrode contacts the second substrate. The second touch electrode contacts the second substrate and is insulated from the first touch electrode. The spacer overlaps the first touch electrode and is positioned between the first touch electrode and the first substrate. The light reflector overlaps the second touch electrode, is positioned between the second touch electrode and the first substrate, and is spaced from the spacer. A distance between the light reflector and the second touch electrode is greater than a distance between the spacer and the first touch electrode.

20 Claims, 6 Drawing Sheets

(51) Int. Cl.
　　　*H01L 51/52*　　　(2006.01)
　　　*G06F 3/044*　　　(2006.01)
(52) U.S. Cl.
　　　CPC ........ *H01L 51/525* (2013.01); *H01L 51/5271* (2013.01); *G06F 2203/04112* (2013.01); *H01L 27/3246* (2013.01)
(58) Field of Classification Search
　　　CPC ..... H01L 27/00–3297; H01L 51/00–56; H01L 21/02362; H01L 21/76829; H01L 21/823468; H01L 29/66553; H01L 29/6656; H01L 45/1691; H01L 51/5268; H01L 51/5281; H01L 2224/0212; H01L 27/32–3293; H01L 51/5044; G09G 3/00–38
　　　See application file for complete search history.

(56) References Cited

U.S. PATENT DOCUMENTS

| | | | |
|---|---|---|---|
| 9,603,239 B2 | 3/2017 | Nishioka et al. | |
| 9,735,210 B2 | 8/2017 | Gu et al. | |
| 9,791,960 B2 | 10/2017 | Hao et al. | |
| 9,933,896 B2 | 4/2018 | Lee et al. | |
| 2007/0013291 A1* | 1/2007 | Cok | B82Y 20/00 313/501 |
| 2008/0151133 A1 | 6/2008 | Kim et al. | |
| 2008/0237612 A1 | 10/2008 | Cok | |
| 2008/0303419 A1 | 12/2008 | Fukuda | |
| 2010/0171416 A1 | 7/2010 | Lee | |
| 2010/0207107 A1 | 8/2010 | Kim | |
| 2011/0241539 A1 | 10/2011 | Yan et al. | |
| 2011/0310033 A1 | 12/2011 | Liu et al. | |
| 2012/0294003 A1 | 11/2012 | Liu et al. | |
| 2013/0050619 A1 | 2/2013 | Kim et al. | |
| 2013/0207911 A1 | 8/2013 | Barton et al. | |
| 2014/0070350 A1* | 3/2014 | Kim | G06F 3/0443 257/432 |
| 2014/0253856 A1 | 9/2014 | Nakahata | |
| 2014/0319470 A1 | 10/2014 | Kim et al. | |
| 2015/0090991 A1 | 4/2015 | Ishii et al. | |
| 2015/0097784 A1 | 4/2015 | Lee et al. | |
| 2015/0115254 A1 | 4/2015 | Choi et al. | |
| 2015/0162386 A1 | 6/2015 | Furuie | |
| 2015/0162387 A1 | 6/2015 | Gu et al. | |
| 2016/0013254 A1 | 1/2016 | Ishii et al. | |
| 2016/0291374 A1 | 10/2016 | Fan et al. | |
| 2017/0010710 A1* | 1/2017 | Kim | C09D 175/04 |

FOREIGN PATENT DOCUMENTS

| | | |
|---|---|---|
| CN | 102736764 A | 10/2012 |
| CN | 102789826 A | 11/2012 |
| CN | 103632752 A | 3/2014 |
| CN | 103943061 A | 7/2014 |
| CN | 104106024 A | 10/2014 |
| CN | 104201190 A | 12/2014 |
| CN | 104360784 A | 2/2015 |
| CN | 104503609 A | 4/2015 |
| KR | 10-2012-0041579 A | 5/2012 |
| KR | 10-2014-0079268 A | 6/2014 |
| KR | 10-1407932 B1 | 6/2014 |
| KR | 10-2014-0129134 A | 11/2014 |
| KR | 10-2015-0041413 A | 4/2015 |
| KR | 10-2015-0049141 A | 5/2015 |
| WO | 2013133026 A1 | 9/2013 |

OTHER PUBLICATIONS

Chinese Communication corresponding to Chinese Patent Application No. 201710050174.2 dated Jul. 9, 2021 8 pages.

* cited by examiner

DISPLAY DEVICE

CROSS-REFERENCE TO RELATED APPLICATION(S)

This application is a continuation application of U.S. patent application Ser. No. 15/409,339 filed Jan. 18, 2017, which claims priority to and the benefit of Korean Patent Application No. 10-2016-0006914 filed in the Korean Intellectual Property Office on Jan. 20, 2016; the entire contents of the Korean Patent Application are incorporated herein by reference.

BACKGROUND

(a) Field

The technical field relates to a display device.

(b) Description of the Prior Art

A display device may include a touch screen (or touch-screen) structure for receiving user input. The touch screen structure may include touch electrodes for sensing touches. In the display device, a touch electrode and a display element (e.g., cathode) may become substantially close to each other and therefore generating significant parasitic capacitance. Such parasitic capacitance may cause errors in touch sensing.

SUMMARY

Embodiments may be related to a display device with minimum undesirable parasitic capacitance.

An embodiment may be related to a display device that includes the following elements: a first base substrate including a plurality of pixel areas; display elements disposed in the pixel areas; a second base substrate facing the first base substrate; a plurality of spacers disposed between the pixel areas and configured to maintain a gap between the first base substrate and the second base substrate; a plurality of touch electrodes provided in the second base substrate and including at least one first region (or first touch electrode set) and at least one second region (or second touch electrode set) electrically insulated from the first region; and light reflection patterns (or light reflection structures) disposed on the first base substrate to correspond to the second region.

In an embodiment, the plurality of spacers may be disposed to correspond to the first region.

In an embodiment, the light reflection patterns may include the same material as the plurality of spacers.

In an embodiment, the light reflection patterns may have a different shape from the plurality of spacers.

In an embodiment, the light reflection patterns may have a lower height than the plurality of spacers.

In an embodiment, at least one portion of the light reflection patterns may include a pattern of protrusions and depressions that are curved.

In an embodiment, at least one portion of the light reflection patterns may include a protruding portion that protrudes toward the plurality of touch electrodes.

In an embodiment, at least one portion of the light reflection patterns may include a recessed portion that is recessed toward the first base substrate.

In an embodiment, the second region may have a shape that surrounds the first region when viewed on the plane.

In an embodiment, the display elements may include a first electrode provided in the pixel area; a pixel defining layer disposed between the pixel areas and exposing at least one portion of the first electrode to the outside; an emission layer disposed on the first electrode and emitting light; and a second electrode disposed on the emission layer.

In an embodiment, the plurality of touch electrodes may include first conductive lines extending in one direction; and second conductive lines extending in a direction crossing the first conductive lines.

In an embodiment, the light reflection patterns may be disposed in the second region in which the first conductive lines and the second conductive lines cross each other.

In an embodiment, the light reflection patterns may have a shape that protrudes toward the second base substrate from the pixel defining layer.

In an embodiment, the light reflection patterns may have a shape in the second region that is recessed inward of the first base substrate from the pixel defining layer.

In an embodiment, the display elements may be disposed in regions where the first conductive lines and the second conductive lines cross each other.

In an embodiment, the second electrode may be provided between the plurality of spacers and the second base substrate.

An embodiment may be related to a display device. The display device may include a first substrate, a second substrate, a transistor, a display element, a first touch electrode, a second touch electrode, a spacer, and a light reflector. The second substrate may overlap the first substrate. The transistor may be positioned between the first substrate and the second substrate. The display element may be electrically connected to the transistor. The first touch electrode may directly contact the second substrate. The second touch electrode may directly contact the second substrate and may be electrically insulated from the first touch electrode. The spacer may overlap (and/or be covered by) the first touch electrode and may be positioned between the first touch electrode and the first substrate. The light reflector may overlap (and/or be covered by) the second touch electrode, may be positioned between the second touch electrode and the first substrate, and may be spaced from the spacer. The minimum distance between the light reflector and the second touch electrode may be greater than the minimum distance between the spacer and the first touch electrode.

The shape/structure of the light reflector may be different from the shape/structure of the spacer.

A material of the spacer may be identical to a spacer of the light reflector.

The display device may include a pixel defining layer. The pixel defining layer may include an opening and may include at least one of a first protrusion, a second protrusion, and a recess. The display element may include a light emission layer. The light emission layer may be positioned inside the opening. The spacer may include the first protrusion. The light reflector may include the second protrusion and/or the recess. The second protrusion may be shorter than the first protrusion if the light reflector includes the second protrusion.

The display element may include a display-element electrode. The minimum distance between the display-element electrode and the first touch electrode may be less than the minimum distance between the spacer and the first touch electrode.

The spacer may be narrower than the first touch electrode in a direction parallel to the first substrate.

The spacer may be taller than the light reflector in a direction perpendicular to the first substrate.

The display element may include a display-element electrode. The spacer may be positioned between a first portion of the display-element electrode and a second portion of the display-element electrode and may directly contact each of the first portion of the display-element electrode and the second portion of the display-element electrode.

A third portion of the display-element may directly contact the spacer and may be positioned between the spacer and the first touch electrode.

The display device may include an insulating layer. The spacer, the first portion of the display-element electrode, and the second portion of the display-element electrode may be positioned between a first portion of the insulating layer and a second portion of the insulating layer.

A third portion of the insulating layer may be positioned between a third portion of the display-element electrode and the first touch electrode and may directly contact each of the third portion of the display-element electrode and the first touch electrode.

The light reflector may be positioned between a fourth portion of the display-element electrode and a fifth portion of the display-element electrode and may directly contact each of the fourth portion of the display-element electrode and the fifth portion of the display-element electrode.

The light reflector, the fourth portion of the display-element electrode, and the fifth portion of the display-element electrode may be positioned between a fourth portion of the insulating layer and a fifth portion of the insulating layer.

A sixth portion of the insulating layer may be positioned between a sixth portion of the display-element electrode and the second touch electrode, may directly contact the sixth portion of the display-element electrode, and may be spaced from the second touch electrode.

A recessed portion of the display-element electrode may be positioned inside a recessed portion of the light reflector and may be positioned between the second touch electrode and the recessed portion of the light reflector.

A recessed portion of the insulating layer may be positioned inside the recessed portion of the display-element electrode and may be positioned between the second touch electrode and the recessed-portion of the display-element electrode.

The light reflector may have a recess, which may be recessed toward the first substrate.

The light reflector may include a protrusion and a recess. The protrusion protrudes toward the second substrate. The recess may be recessed toward the first substrate.

The light reflector may include two protrusions. The display element may include a display-element electrode. A portion of the display-element electrode may be positioned between the two protrusions and may be positioned between the second touch electrode and the first substrate.

The light reflector may include two protrusions. The display element may include a display-element electrode. Two portions of the display-element electrode may directly contact the two protrusions, may be positioned between the two protrusions, and may be oriented not parallel to each other.

The display device may include an insulating layer. Two portions of the insulating layer may be positioned between the two portions of the display-element electrode and may be oriented at an acute angle with respect to each other.

The display device may include a third touch electrode, a fourth touch electrode, and a fifth touch electrode, which may directly contact the second substrate, may be spaced from one another, and may be spaced from each of the first touch electrode and the second touch electrode. The display device may include a first additional light reflector, which may overlap the third touch electrode and may be positioned between the third touch electrode and the first substrate. The display device may include a second additional light reflector, which may overlap the fourth touch electrode and may be positioned between the fourth touch electrode and the first substrate. The display device may include a third additional light reflector, which may overlap the fifth touch electrode and may be positioned between the fifth touch electrode and the first substrate. The spacer may be positioned between the light reflector and the first additional light reflector and may be positioned between the second additional light reflector and the third additional light reflector. The light reflector, the spacer, and the first additional light reflector may be aligned in a first direction. The second additional light reflector, the spacer, and the third additional light reflector may be aligned in a second direction different from the first direction.

The spacer may be not identical to any of the light reflector, the first additional light reflector, the second light reflector, and the third light reflector in shape and/or structure. The light reflector, the first additional light reflector, the second light reflector, and the third light reflector may be identical to one another in shape and/or structure. The spacer, the light reflector, the first additional light reflector, the second light reflector, and the third light reflector may be formed of the same material.

According to embodiments, one or more spacers in a display device can maintain a sufficient gap between touch electrodes and display elements. Advantageously, undesirable parasitic capacitance between the touch electrodes and the display elements can be minimized.

According to embodiments, the light reflection structure may enable the spacer to be substantially inconspicuous to users.

DETAILED DESCRIPTION OF EMBODIMENTS

An embodiment relates to a display device that is capable of displaying an image and sensing a user's touch. The display device according to the current embodiment may sense a touch event provided by a user's hand, a stylus, and/or another input means and, in response to the touch event, may display or transmit image information.

Embodiments are described with reference to the drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively. In this application, "pattern" may mean "structure" or "member"; "connect" may mean "electrically connect"; "insulate" may mean "electrically insulate".

Figure 1:
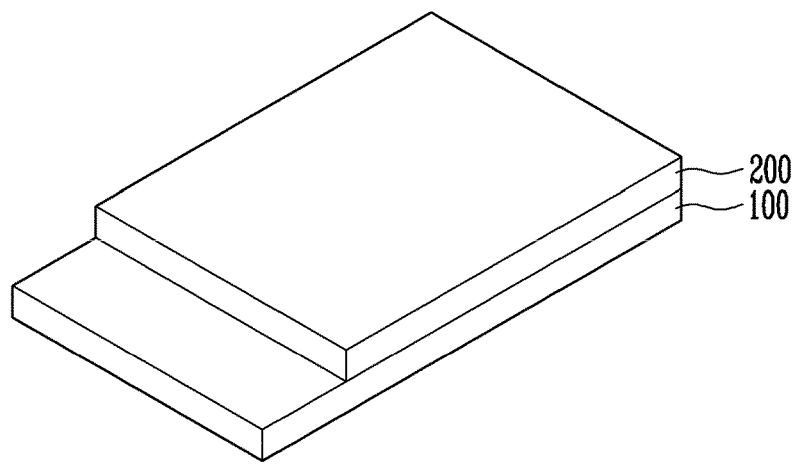
FIG. 1 is a perspective view of a display device according to an embodiment.
Figure 2:
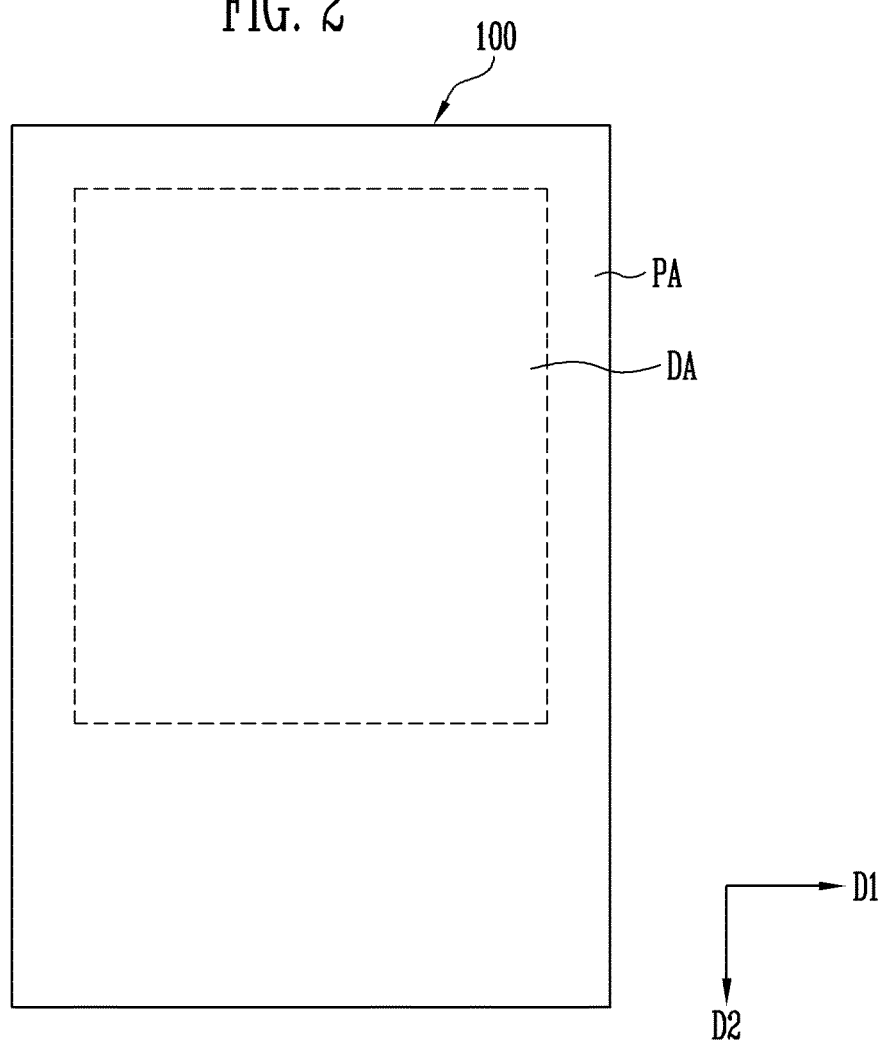
FIG. 2 is a top plan view of a display unit of the display device illustrated in FIG. 1 according to an embodiment.
Figure 3:
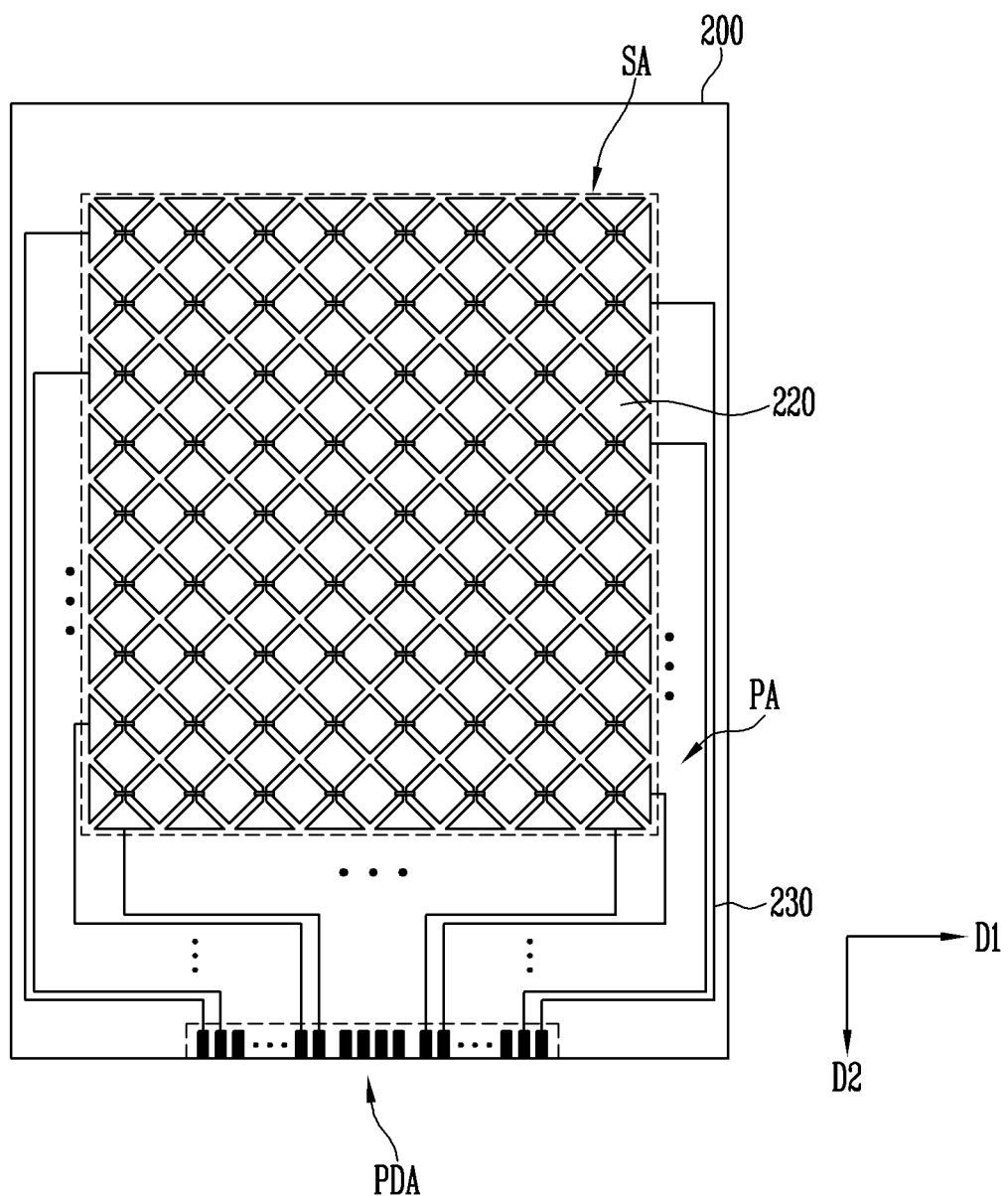
FIG. 3 is a top plan view of a touch unit of the display device illustrated in FIG. 1 according to an embodiment.

FIG. 1 is a perspective view of a display device according to an embodiment, FIG. 2 is a top plan view of the display unit of FIG. 1 according to an embodiment, and FIG. 3 is a top plan view of a touch unit of FIG. 1 according to an embodiment.

Referring to FIGS. 1 to 3, the display device may have one or more of various shapes, for example, a rectangular shape with two pairs of parallel sides. One of the two pairs of sides may be longer than the other pair.

For better understanding and ease of description, an extending direction of the short sides is denoted as a first direction D1, and an extending direction of the long sides denoted as a second direction D2.

The display device includes a display unit 100, in which display elements for displaying an image are provided, and a touch unit 200 for sensing a touch.

The display device includes a display area DA in which an image is displayed, a sensing area SA for sensing a user's touch and/or pressure in the touch unit 200 when a touch event occurs, and a peripheral area PA neighboring and/or abutting the display area DA and/or the sensing area SA. The sensing area SA may overlap the display area DA, and may be as large as or larger than the display area DA.

The display unit 100 may display visual information, for example, one or more of text, video, a photo, a two-dimensional or a three-dimensional image, etc. Hereinafter, the visual information is denoted as "image". The display unit 100 may be implemented using one or more technologies for displaying an image.

The display unit 100 includes the display area DA and the peripheral area PA. The display area DA may include a plurality of pixel areas in which display elements are provided. The peripheral area PA may be a non-display area, which may not dynamically display images, and may be disposed adjacent to the display area DA.

The display unit 100 may include a plurality of signal wires and a plurality of thin film transistors connected to the plurality of signal wires. Each of the display elements may be electrically connected to one of the thin film transistors.

Each of the display elements may include a first electrode connected to the thin film transistor, an emission layer disposed on the first electrode, and a second electrode disposed on the emission layer. The emission layer may include a light generation layer from which light is generated by combining electrons and holes injected through the first and second electrodes.

The touch unit 200 may be provided on a front side of the display unit 100, that is, a side where the image is displayed to a user, and may also be provided integrally with the display unit 100. During manufacturing, the touch unit 200 may be provided on top of the display unit 100.

The touch unit 200 includes a sensing area SA and a peripheral area PA. The sensing area SA may correspond to the display area DA of the display unit 100. The peripheral area PA may be disposed adjacent to the sensing area SA. The peripheral area PA may correspond to the peripheral area PA of the display unit 100.

The touch unit 200 may include a touch sensing unit that is provided in the sensing area SA, and a wire portion that is provided in the peripheral area PA.

The touch sensing unit may sense a touch event provided to the display device via a user's hand or separate input means. In an embodiment, the touch sensing unit may be a capacitive touch sensor in which a change in capacitance between two sensing electrodes is sensed.

The touch sensing unit includes touch electrodes 220 that are provided in the sensing area SA. In the touch unit 200, the touch electrodes 220 are disposed on a surface that faces the display unit 100, and may be connected to a pad area PDA via sensing lines 230. The touch electrodes 220 may be arranged in various ways according to embodiments.

In an embodiment, some of the touch electrodes 220 may include a plurality of sensing electrode rows that are electrically connected to and parallel to each other in a first direction D1; some of the touch electrodes 220 may include a plurality of sensing electrode columns that are connected in a direction D2 and are parallel to each other.

The wire portion connects the touch sensing unit with a driving circuit (not shown) that may drive the touch unit 200. The driving circuit may include a position detection circuit. The wire portion may transmit a sensing input signal from the driving circuit to the plurality of touch electrodes 220, and/or may transmit a sensing output signal from the plurality of touch electrodes 220 to the driving circuit. The wire portion may include the sensing lines 230 that are connected to the plurality of touch electrodes 220.

Figure 4:
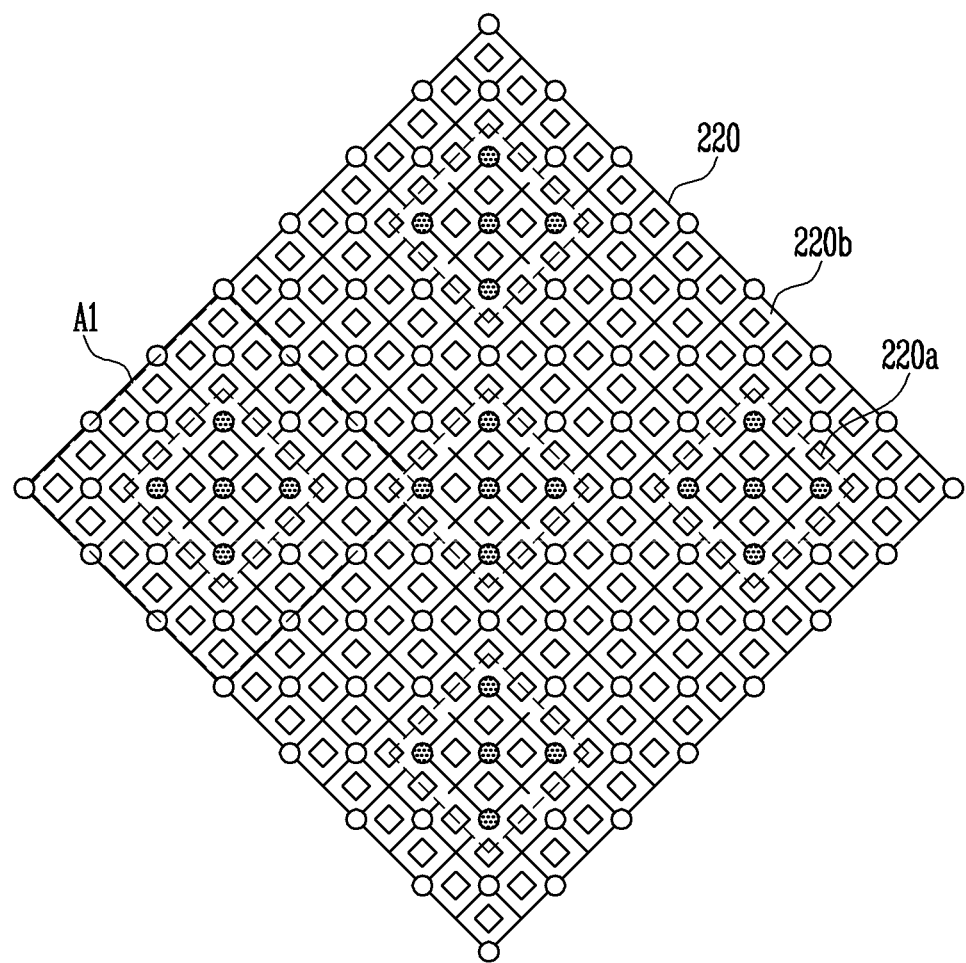
FIG. 4 is a top plan view of a region corresponding to a touch electrode illustrated in FIG. 3 according to an embodiment.
Figure 5:
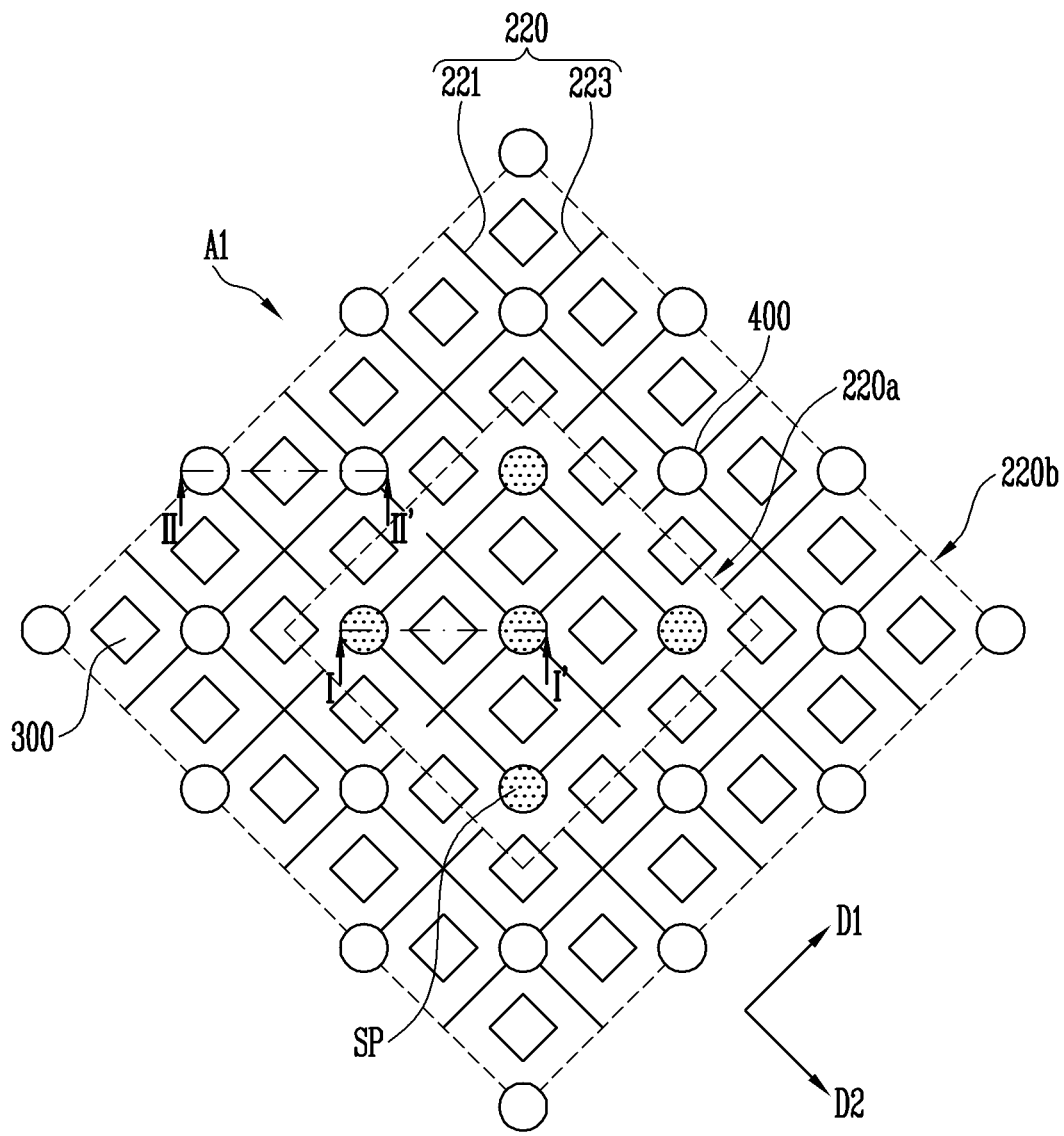
FIG. 5 is a top plan view of the portion A1 indicated in FIG. 4 according to an embodiment.
Figure 6:
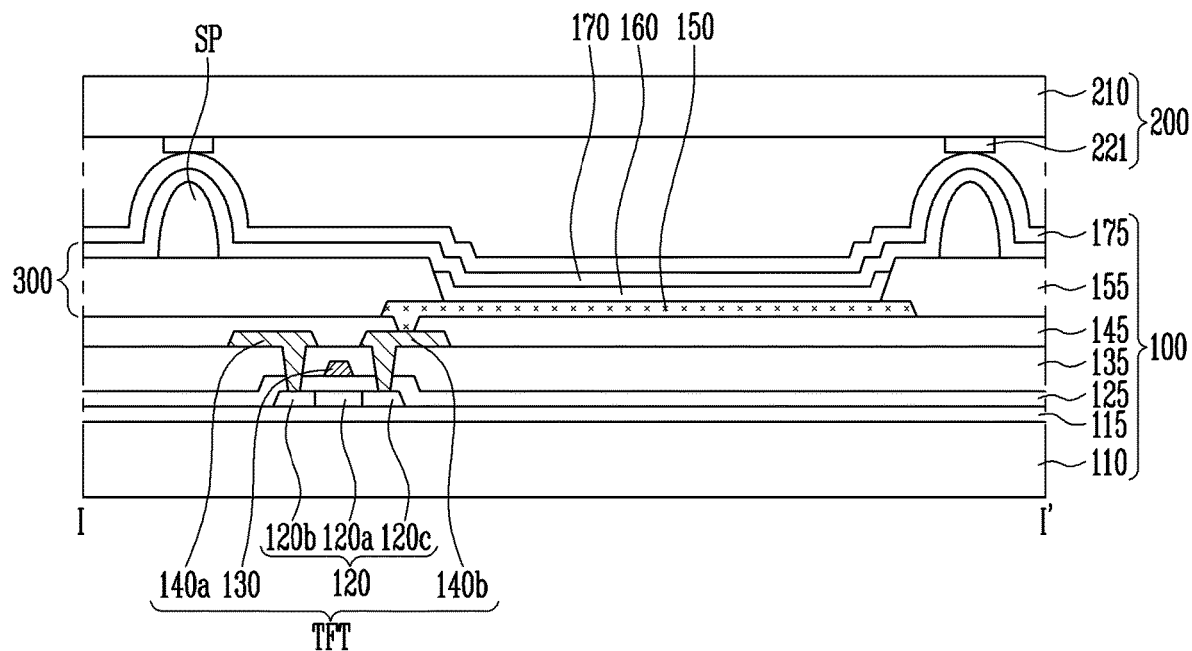
FIG. 6 is a cross-sectional view taken along the line I-I' indicated in FIG. 5 according to an embodiment.
Figure 7:
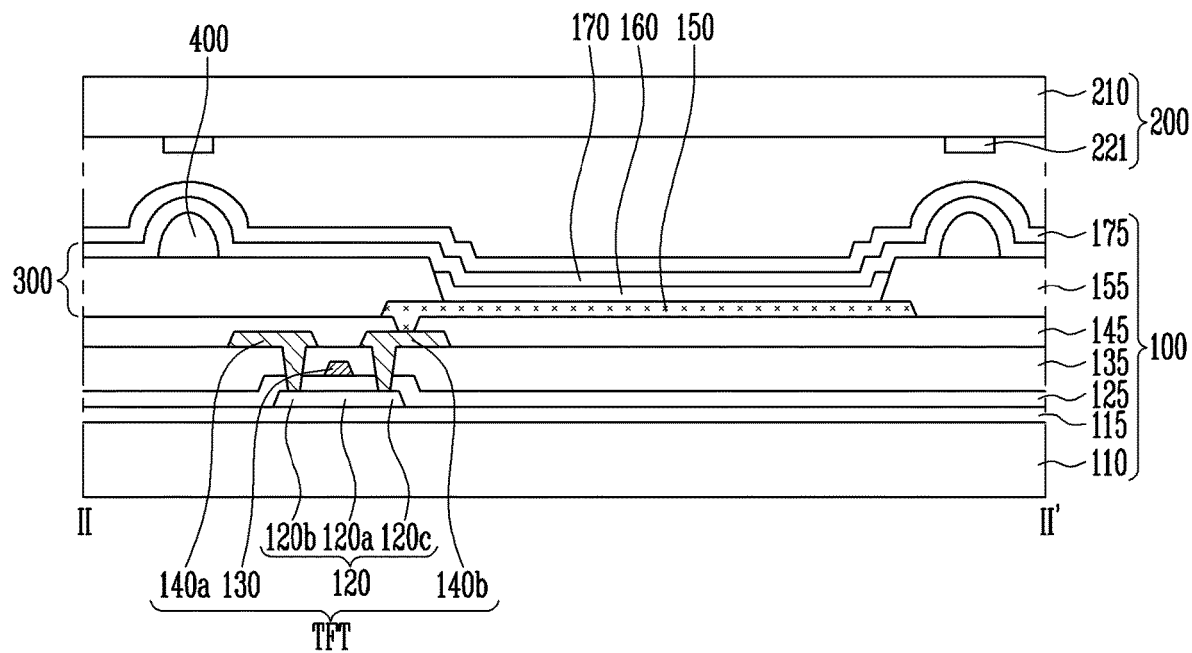
FIG. 7 is a cross-sectional view taken along the line II-I' indicated in FIG. 5 according to an embodiment.

FIG. 4 is a top plan view of a region corresponding to a touch electrode illustrated in FIG. 3 according to an embodiment, FIG. 5 is a top plan view of the portion A1 indicated in FIG. 4 according to an embodiment, FIG. 6 is a cross-sectional view of FIG. 5 taken along the line I-I' according to an embodiment, and FIG. 7 is a cross-sectional view of FIG. 5 taken along the line II-II' according to an embodiment.

Referring to FIGS. 3 to 7, the display device includes the following elements: a display unit 100 in which display elements 300 are provided; spacers SP disposed between adjacent display elements 300; and a touch unit 200 disposed on the display unit 100. The touch unit 200 includes a substrate 210 and touch electrodes 220 (including 221 and 223) disposed on a surface of the substrate 210 that faces the display unit 100.

The display unit 100 may include a display area DA and a peripheral area PA. The display area DA may include a plurality of pixel areas. The peripheral area PA, which is a non-display area that does not dynamically display images, may be disposed adjacent to the display area DA. In an embodiment, the display unit 100 may include a first base substrate 110, one or more thin film transistors (TFT) disposed in/near the pixel areas on the first base substrate 110, and the display elements 300.

The first base substrate 110 can transmit light since it includes a transparent insulating material. In an embodiment, the first base substrate 110 may be a rigid substrate or a flexible substrate. The rigid substrate may include at least one of a glass substrate, a quartz substrate, a glass-ceramic substrate, and a crystalline glass substrate. The flexible substrate may include at least one of a film substrate and a plastic substrate that include a polymer organic material. During a manufacturing process of the display device, it is desirable that a material of the first base substrate 110 has resistance against high processing temperatures (or high heat resistance).

A buffer layer 115 may be disposed between the first base substrate 110 and the thin film transistors (TFT). The buffer layer 115 may include at least one of a silicon oxide and a silicon nitride.

A semiconductor pattern 120 may be provided on the buffer layer 115. The semiconductor pattern 120 is formed of a semiconductor material, and acts as an active layer of the thin film transistor (TFT). The semiconductor pattern 110 may include a source region 120b, a drain region 120c, and a channel region 120a provided between the source region 120b and the drain region 120c. An inorganic semiconductor or an organic semiconductor may be selected to form the semiconductor pattern 120. The source region 120b and the drain region 120c may be doped with n-type or p-type impurities.

An interlayer insulating layer 125 may be disposed on the semiconductor pattern 120. The interlayer insulating layer 125 may cover the semiconductor pattern 120, and may insulate the semiconductor pattern 120 from the gate electrode 130. The interlayer insulating layer 125 may include at least one of a silicon oxide and a silicon nitride.

The gate electrode 130 may be disposed on the interlayer insulating layer 125. The gate electrode 130 may include a low resistance conductive material, and may be provided to cover a region corresponding to the channel region 120a of the semiconductor pattern 120.

The gate electrode 130 may be, for example, made of a single kind of metal, various kinds of metals, or an alloy. Specifically, the gate electrode 130 may be made of one or more of molybdenum (Mo), tungsten (W), aluminum neodymium (AlNd), titanium (Ti), aluminum (Al), silver (Ag), and an alloy. The gate electrode 130 may include a material mixture that forms a single layer. The gate electrode 130 may have a dual layer structure or a multilayer structure formed of at least a low resistance material, such as molybdenum (Mo), aluminum (Al), and/or silver (Ag), to reduce wire resistance.

A gate insulating layer 135 may be provided on the gate electrode 130. The gate insulating layer 135 may include the same material as the interlayer insulating layer 125. The gate insulating layer 135 may insulate the source electrode 140a and the drain electrode 140b from the gate electrode 130.

Openings (or contact holes) penetrating through the interlayer insulating layer 125 and the gate insulating layer 135 may expose the source region 120b and the drain region 120c of the semiconductor pattern 120.

The source electrode 140a and the drain electrode 140b may be provided on the gate insulating layer 135. The source electrode 140a and the drain electrode 140b may be disposed to be separated from each other on the gate insulating layer 135.

The source electrode 140a and the drain electrode 140b may be formed of a single kind of metal, but may be formed of two or more kinds of metal or an alloy of two or more kinds of metals. In an embodiment, the source electrode 140a and the drain electrode 140b may be formed as a single layer, which is made of at least one of molybdenum (Mo), tungsten (W), molybdenum tungsten (MoW), aluminum neodymium (AlNd), titanium (Ti), aluminum (Al), silver (Ag), and an alloy or a material mixture. In an embodiment, the electrodes 140a and 140b may have a dual layer structure or a multilayer structure formed of at least a low resistance material, such as molybdenum (Mo), aluminum (Al), and/or silver (Ag), to reduce wire resistance.

One end of the source electrode 140a may be connected to a data line (not shown). The other end of the source electrode 140a may contact the source region 120b through one of the openings. One end of the drain electrode 140b may contact the drain region 120c through the other one of the openings. The other end of the drain electrode 140b may be connected to one of the display elements 300.

In an embodiment, the thin film transistor (TFT) is a thin film transistor having a top gate structure. In an embodiment, the thin film transistor (TFT) may be a thin film transistor that has a bottom gate structure.

A passivation layer 145 may be provided on the first base substrate 110 in which the thin film transistor (TFT) is disposed. The passivation layer 145 covers the thin film transistor (TFT), and may include at least one layer. In an embodiment, the passivation layer 145 may include an organic insulating material that can planarize a surface by reducing unevenness of the lower structure. One or more of an acrylic resin, benzocyclobutene (BCB), polyimide (PI), polyamide (PA), and a phenolic resin may be included in the organic insulating material.

In the passivation layer 145, a contact hole exposing a part of the drain electrode 140b is formed using a photolithography process and/or a different process.

The display elements 300 may be provided on the passivation layer 145. The display elements 300 may include a first electrode 150 connected to the drain electrode 140b, an emission layer 160 disposed on the first electrode 150, and a second electrode 170 disposed on the emission layer 160.

One of the first electrode 150 and the second electrode 170 may be an anode, and the other may be a cathode. For example, the first electrode 150 may be an anode, and the second electrode 170 may be a cathode.

In an embodiment, at least one of the first electrode 150 and the second electrode 170 may be a transmissive electrode (or transparent electrode). In an embodiment, the display elements 300 are bottom-emission organic light emitting diodes, the first electrode 150 may be a transmissive electrode, and the second electrode 170 may be a reflective electrode. In an embodiment, the display elements 300 are top-emission organic light emitting diodes, the first electrode 150 may be a reflective electrode, and the second electrode 170 may be a transmissive electrode. In an embodiment, the display elements 300 are dual-emission organic light emitting diodes, each of the first electrode 150 and the second electrode 170 may be a transmissive electrode. In an embodiment, the display elements 300 are top-emission organic light emitting diodes, and the first electrode 150 is an anode.

In each pixel area, a first electrode 150 may be disposed on the passivation layer 145. The first electrode 150 may include a reflective layer (not shown) that can reflect light, and a transparent conductive layer (not shown) disposed above or below the reflective layer. At least one of the transparent conductive layer and the reflective layer may be connected to the drain electrode 140b.

The reflective layer may include a material that can reflect light. For example, the reflective layer may include at least one of aluminum (Al), silver (Ag), chromium (Cr), molybdenum (Mo), platinum (Pt), nickel (Ni), and an alloy.

The transparent conductive layer may include a transparent conductive oxide. For example, the transparent conductive layer may include at least one of indium tin oxide (ITO), indium zinc oxide (IZO), aluminum zinc oxide (AZO), gallium-doped zinc oxide (GZO), zinc tin oxide (ZTO), gallium tin oxide (GTO), and fluorine-doped tin oxide (FTO).

A pixel defining layer 155 may be provided on the first electrode 150. The pixel defining layer 155 may include an opening that exposes the first electrode 150. In an embodiment, the pixel defining layer 155 may overlap an edge portion of the first electrode 150. The opening of the pixel defining layer 155 may expose most of a surface of the first electrode 150 that faces the touch unit 200.

The pixel defining layer 155 may include an organic insulating material. For example, the pixel defining layer 155 may include at least one of polystyrene, polymethyl methacrylate (PMMA), polyacrylonitrile (PAN), polyamide (PA), polyimide (PI), polyarylether (PAE), a heterocyclic polymer, parylene, epoxy, benzocyclobutene (BCB), a siloxane-based resin, and a silane-based resin.

The spacers SP and the light reflection patterns 400 may be disposed (directly) on the pixel defining layer 155.

The spacers SP may protrude toward the touch unit 200 from the pixel defining layer 155 such that a gap between the display unit 100 and the touch unit 200 is maintained. Even if an external pressure is applied to the display unit 100 or the touch unit 200, the spacers SP may prevent the touch unit 200 from contacting the display elements 300, such that the display elements 300 are not damaged.

The spacers SP are provided such that display characteristics of the display elements 300 are not significantly affected by an external impact, and may be regularly or randomly disposed in the display area DA.

The light reflection patterns 400 (or light reflectors 400) may protrude toward the touch unit 200 from the pixel defining layer 155, and may be provided in regions where no spacers SP are disposed.

The spacers SP and the light reflection patterns 400 may each include an organic insulating material. For example, the spacers SP and the light reflection patterns 400 may include the same material as the pixel defining layer 155. In an embodiment, the pixel defining layer 155 and the spacers SP may be sequentially or separately formed, and/or may be separate structures that are made of different materials. In an embodiment, the pixel defining layer 155 and the light reflection patterns 400 may be sequentially or separately formed, and/or may be separate structure that are made of different materials.

The pixel defining layer 155, the spacers SP, and the light reflection patterns 400 may be formed through an exposure process using a halftone mask. In an embodiment, the light reflection patterns 400 may be lower, thinner, and/or shorter than the plurality of spacers SP.

The emission layer 160 may be disposed inside an opening of the layer 155 on the surface of the first electrode 150 that is exposed by the opening. The emission layer 160 may have a multi-layered thin film structure that includes at least a light generation layer (LGL). A color of the light generated from the light generation layer may be one of red, green, blue, and white, and/or one of other colors.

The second electrode 170 may be provided on the emission layer 160. The second electrode 170 may extend to the pixel defining layer 155 and the spacers SP. The second electrode 170 may be a transflective layer. In an embodiment, the second electrode 170 may be a thin metal layer, which is thin enough to transmit light.

The second electrode 170 may include a material that has a lower work function than that of a transparent conductive layer. For example, the second electrode 170 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy.

Some of the light emitted from the emission layer 160 may not be transmitted through the second electrode 170, and the light reflected from the second electrode 170 may be reflected again from the reflective layer of the electrode 150. That is, the light emitted from the emission layer 160 may be resonated between the reflective layer and the second electrode 170. Light efficiency of the display elements 300 may be improved by the resonance of the light.

A capping layer 175 (or insulating layer 175) may be provided on the second electrode 170. The capping layer 175 allows a gap between the second electrode 170 and the touch unit 200 to be maintained. The capping layer 175 may include an insulating material that can insulate the second electrode 170 from the touch unit 200.

The touch unit 200 may separate the display elements 300 from an external environment. In an embodiment, the touch unit 200 may include a second base substrate 210 that includes the same material as the first base substrate 110, and touch electrodes 220 that are disposed on the second base substrate 210. The second base substrate 210 may be bonded to the first base substrate 110 by a sealant.

The touch unit 200 may include a sensing area SA, and a peripheral area PA disposed adjacent to the sensing area SA. The sensing area SA may correspond to the display area DA of the display unit 100. The peripheral area PA may correspond to the peripheral area of the display unit 100 PA.

The touch electrodes 220 may be disposed in the sensing area SA (directly) on a surface of the substrate 210 that faces the display unit 100.

The touch electrodes 220 may include at least one first region 220a (or first touch electrode set 220a), and a second region 220b (or second touch electrode set 220b) electrically insulated from the first region 220a. In the plan view, the second region 220b (or second touch electrode set 220b) may substantially or completely surround the first region 220a (or first touch electrode set 220a). That is, the first region 220a may have an isolated island shape that is surrounded by the second region 220b.

The touch electrodes 220 may include a metal mesh. More in an embodiment, the touch electrodes 220 may include a plurality of conductive lines that cross each other.

The plurality of conductive lines may include a plurality of first conductive lines 221 that extend in a direction D1, and a plurality of second conductive lines 223 that extend in a direction D2 different from (e.g., perpendicular to) the direction D1.

Regions formed at/near intersections of the first conductive lines 221 and the second conductive lines 223 may correspond to the pixel area. In an embodiment, the display elements 300 may be disposed in/near intersections of the first conductive lines 221 and the second conductive lines 223.

The plurality of conductive lines in the first region 220a (or first touch electrode set 220a) may be electrically separated from the plurality of conductive lines that are in the second region 220a (or second touch electrode set 220b). The first conductive lines 221 in the first region 220a may be electrically separated from the first conductive lines 221 in the second region 220b, and the second conductive lines 223 in the first region 220a may be electrically separated from the second conductive lines 223 in the second region 220b. In an embodiment, first conductive lines 221 disposed in the first region 220a and the second conductive lines 223 may be electrically separated from each other.

In an embodiment, the spacers SP may be disposed only in a region corresponding to the first region 220a (or first touch electrode set 220a), and may not be disposed in a region corresponding to the second region 220b (or second touch electrode set 220b). In an embodiment, the light reflection patterns 400 may be disposed only in the region corresponding to the second region 220b (or second touch electrode set 220b), and may not be disposed in the region corresponding to the first region 220a (or first touch electrode set 220a). In an embodiment, the spacers SP may be disposed only in the region corresponding to the first region 220a, and the light reflection patterns 400 may be disposed only in the region corresponding to the second region 220b.

The light reflection patterns 400 may be lower, thinner, and/or shorter than the spacers SP as a result of a manufacturing process, e.g., an exposure process. In an embodiment, a shape/structure of each of the light reflection patterns 400 may be different from a shape/structure of each of the spacers SP.

In an embodiment, a distance between the display element 300 and the touch electrode 220 in the second region 220b may be different from that between the display element 300 and the touch electrode 220 in the first region 220b. In an embodiment, the distance between the display element 300 and the touch electrode 220 in the second region 220b may be greater than the distance between the display element 300 and the touch electrode 220 in the first region 220a by a difference between heights of the light reflection pattern 400 and the spacer SP. According to embodiments, the distance between the display element 300 and the touch electrode 220 in the second region 220b is sufficient secured, and undesirable parasitic capacitance generated between the display element 300 and the touch electrode 220 may be minimized.

If only the spacers SP are disposed in the region corresponding to the first region 220a, and if no light reflection patterns 400 are disposed in the region corresponding to the second region 220b, when external light is incident on the display unit 100, the light may be reflected by the spacers SP, such that the spacers SP may be significantly conspicuous to a user. As a result, the user may perceive unsatisfactory image quality.

In embodiments, the light reflection patterns 400, which reflect light t in a way similar to how the spacers SP reflect light, may be disposed in the second region 220b that surrounds the first region 220a. As a result, reflected light may be visible throughout substantially the entire region of the display unit 100. Advantageously, reflected light can be substantially uniformly provided, and satisfactory image quality may be perceived by the user.

Figure 8:
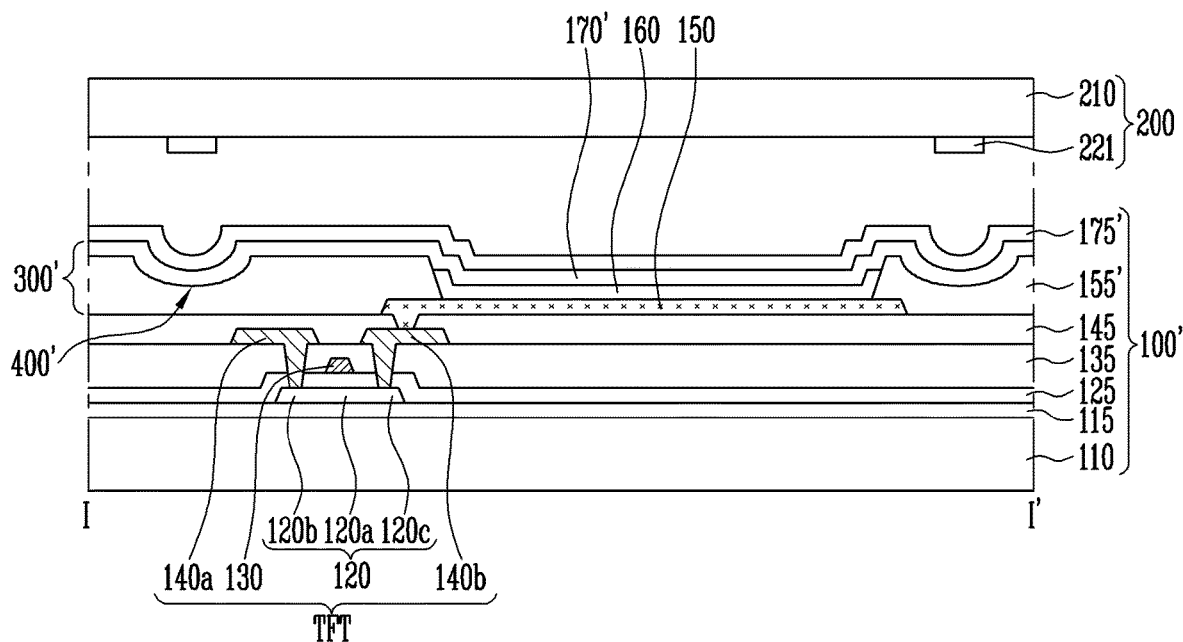
FIG. 8 is a cross-sectional view of a display device according to an embodiment.

FIG. 8 is a cross-sectional view of a display device according to an embodiment. I Referring to FIG. 8, the display device includes a display unit 100' (which includes a display element 300') and a touch unit 200 disposed on the display unit 100'. Touch electrodes ((analogous/identical to electrodes 220 of FIG. 7) are disposed on a surface of the touch unit 200 facing the display unit 100'.

The display unit 100' may include a first base substrate 110, at least one or more thin film transistors (TFTs) disposed in a pixel area on the first base substrate 110, and the display elements 300'.

Each of the display elements 300' may include a first electrode 150 connected to the thin film transistor (TFT), an emission layer 160 disposed on the first electrode 150, and a second electrode 170 disposed on the emission layer 160'.

The pixel defining layer 155' may be provided on the first electrode 150. The pixel defining layer 155' may be provided with an opening, which is disposed between the pixel areas and exposes the first electrode 150. In an embodiment, the pixel defining layer 155' may include a light reflection pattern 400' that is recessed toward the first base substrate 110 in a region corresponding to the first conductive lines 221 of the touch electrode 220.

In an embodiment, the light reflection pattern 400' has a recessed portion that is recessed toward the first base substrate 110 from the pixel defining layer 155. In an embodiment, the recessed portion of the light reflection pattern 400' may have a round shape (or curved shape), as shown in the drawing.

Due to the light reflection pattern 400, a distance between the touch electrodes 220 of the touch unit 200 and the second electrode 170' of the display unit 100 may increase such that the gap between the touch electrodes 220 and the second electrode 173 is sufficiently maintained. As a result, parasitic capacitance between the touch electrodes 220 and the second electrode 170' may be minimized.

Table 1 below shows values of parasitic capacitance between a touch electrode and a second electrode (or a display-element electrode) according to sizes of a gap between the touch electrode and the second electrode.

TABLE 1

| Parasitic capacitance values (pF) | Gap between touch electrode and second electrode is 2 μm | Gap between touch electrode and second electrode is 4 μm | Gap between touch electrode and second electrode is 6 μm | Gap between touch electrode and second electrode is 8 μm |
| --- | --- | --- | --- | --- |
| Experimental group | 0.17 | 0.157 | 0.15 | 0.146 |
| Embodiment illustrated in FIG. 7 | 0.07 | 0.05 | 0.03 | 0.03 |
| Embodiment illustrated in FIG. 8 | 0.05 | 0.03 | 0.03 | 0.02 |

In Table 1, the experimental group may represent a structure in which spacers are uniformly disposed across the entire region of the display device. The embodiment illustrated in FIG. 7 may represent a structure in which spacers are disposed in a specific region of the display device (e.g., the first region (220a of FIG. 5)), and light reflection patterns having a lower height than the spacers are disposed in regions other than the specific region. The embodiment illustrated in FIG. 8 may represent a structure in which spacers are disposed in a specific region of the display device, and light reflection patterns having a recessed portion downward from the pixel defining layer are disposed in regions other than the specific region.

Table 1 shows that as the gap between touch electrode and the second electrode increases, related parasitic capacitance decreases.

Table 1 further shows that the embodiments including light reflection patterns, compared with experimental group including no light reflection pattern, produce lower parasitic capacitance between the touch electrode and the second electrode.

According to embodiments, spacers are disposed only in specific regions of the display device, and light reflection patterns are disposed in regions other than the specific regions. Therefore, sufficient gaps between touch electrodes and second electrodes are reinforced in the regions where the light reflection patterns are formed. Advantageously, parasitic capacitance may be minimized.

Figure 9:
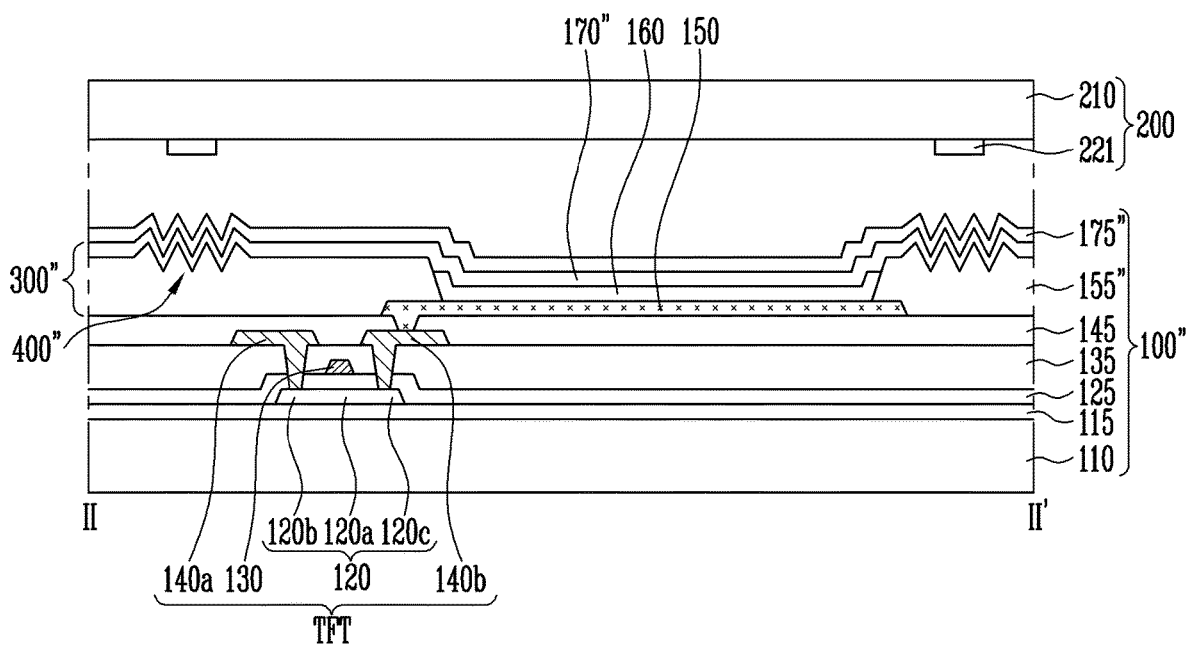
FIG. 9 is a cross-sectional view of a display device according to an embodiment.

FIG. 9 is a cross-sectional view of a display device according to an embodiment. an Referring to FIG. 9, the display device includes a display unit 100" (which includes display elements 300") and a touch unit 200 disposed on the display unit 100". Touch electrodes (analogous/identical to electrodes 220 of FIG. 7) are disposed on a surface of the touch unit 200 facing the display unit 100".

The display unit 100" may include a first base substrate 110, one or more thin film transistors (TFT) disposed in a pixel area on the first base substrate 110, and the display elements 300".

Each of the display elements 300" may include a first electrode 150 connected to the thin film transistor (TFT), an emission layer 160 disposed on the first electrode 150, and a second electrode 170" disposed on the emission layer 160.

A pixel defining layer 155" may be provided on the first electrode 150. The pixel defining layer 155" may be disposed between the pixel areas and may include an opening that exposes at least one portion of the first electrode 150. In an embodiment, the pixel defining layer 155" may include at least one portion that has protrusions and depressions in a region corresponding to the first conductive lines 221 of the touch electrode 220.

In an embodiment, the protrusions and depressions may form a light reflection pattern 400". The protrusions (or protruding portions) may protrude toward the touch unit 200 from the pixel defining layer 155". In an embodiment, the depressions (or recessed portions) may be recessed toward the first base substrate 110 from the pixel defining layer 155".

The protruding portions and the recessed portions of the light reflection pattern 400" may be formed using one or more of various methods such as one or more of laser processing, wet or dry etching, an imprint process, etc. In embodiments, the protruding portion and the recessed portion of the light reflection pattern 400" may be formed using a halftone mask process.

The display device may include spacers analogous to or identical to some of the previously described spacers. Accordingly, a gap between the touch electrodes 220 and the second electrode 170" may be sufficiently maintained. Therefore, undesirable parasitic capacitance formed between the touch electrodes 220 and the second electrode 170" may be minimized or prevented.

It will be appreciated by those skilled in the art that changes may be made in these embodiments without departing from the principles and spirit within the scope defined by the claims.

What is claimed is:

1. A display device comprising:
   a substrate including a plurality of pixel areas;
   a plurality of display elements disposed on the substrate;
   a plurality of spacers disposed between the plurality of pixel areas;
   light reflection patterns adjacent to the plurality of spacers on the substrate; and
   a plurality of first and second touch electrodes disposed on the plurality of display elements, a touch electrode of the plurality of first and second touch electrodes including a plurality of metal mesh lines and a plurality of openings located at least in part between the plurality of metal mesh lines, wherein
   each of the plurality of openings in adjacent metal mesh lines form a lengthwise discontinuity among the plurality of metal mesh lines, and wherein
   the plurality of openings is surrounded by a subset of the light reflection patterns in a plan view of the display device.

2. The display device of claim 1, wherein:
   at least one virtual line connecting a plurality of openings located on a same line among the plurality of openings extends oblique relative to an edge of the substrate, and
   the at least one virtual line comprises a plurality of virtual lines.

3. The display device of claim 2, wherein the at least one virtual line corresponds to a center of each of at least some pixel areas among the plurality of pixel areas.

4. The display device of claim 3, wherein:
   the touch electrode includes a first region and a second region electrically insulated from the first region,
   the first region is an area surrounded by the plurality of virtual lines, and
   the second region is an area excluding the first region.

5. The display device of claim 4, wherein the first region has an isolated island shape that is surrounded by the second region in a plan view.

6. The display device of claim 4, wherein:
   the plurality of metal mesh lines include first metal mesh lines extending in a first direction and second metal mesh lines extending in a second direction crossing the first direction; and
   the first and second metal mesh lines in the first region are electrically separated from the first and second metal mesh lines in the second region.

7. The display device of claim 6, wherein:
   the light reflection patterns are disposed to correspond to the second region, and
   the plurality of spacers are disposed to correspond to the first region.

8. The display device of claim 7, wherein:
   the light reflection patterns are positioned within the second region and surround the plurality of spacers, and
   the plurality of spacers are positioned within the first region and surrounded by the light reflection patterns.

9. The display device of claim 8, wherein the light reflection patterns are disposed in the second region in which the first metal mesh lines and the second metal mesh lines cross each other.

10. The display device of claim 8, wherein the light reflection patterns include a same material as the plurality of spacers.

11. The display device of claim 8, wherein the light reflection patterns have a different shape from the plurality of spacers.

12. The display device of claim 11, wherein the light reflection patterns have a lower height than the plurality of spacers.

13. The display device of claim 7, wherein each of the plurality of display elements includes:
a first electrode provided in each of the plurality pixel areas;
an emission layer disposed on the first electrode and emitting light; and
a second electrode disposed on the emission layer.

14. The display device of claim 13, further comprising:
a pixel defining layer disposed between the plurality of pixel areas; and
a capping layer disposed on the second electrode,
wherein the capping layer is disposed between the plurality of display elements and the plurality of first and second touch electrodes.

15. The display device of claim 13, wherein the plurality of display elements are disposed in the second region in which the first metal mesh lines and the second metal mesh lines cross each other.

16. The display device of claim 1, wherein a subset of the plurality of spacers is surrounded by the plurality of openings in the plan view of the display device.

17. The display device of claim 16, wherein a spacer of the plurality of spacers is surrounded by the subset of the plurality of spacers in the plan view of the display device.

18. A display device comprising:
a substrate including pixel areas;
display elements disposed on the substrate;
spacers disposed between the pixel areas;
light reflection patterns adjacent to the spacers on the substrate; and
first and second touch electrodes disposed on the display elements, a touch electrode of the first and second touch electrodes including metal mesh lines and openings located at least in part between the metal mesh lines, wherein
each of the openings in adjacent metal mesh lines form a lengthwise discontinuity among the metal mesh lines, wherein
the touch electrode includes a first region and a second region electrically insulated from the first region, wherein
some of the light reflection patterns are positioned within the second region and surround the first region, and wherein
some of the spacers are positioned within the first region, wherein
the openings and a subset of the display elements are surrounded by a subset of the light reflection patterns in a plan view of the display device.

19. A display device comprising:
a substrate including pixel areas;
display elements disposed on the substrate;
spacers disposed between the pixel areas;
light reflection patterns adjacent to the spacers on the substrate; and
first and second touch electrodes disposed on the display elements, a touch electrode of the first and second touch electrodes including metal mesh lines and openings located at least in part between the metal mesh lines, wherein
each of the openings in adjacent metal mesh lines form a lengthwise discontinuity among the metal mesh lines, wherein
the openings and a subset of the display elements are surrounded by a subset of the light reflection patterns in a plan view of the display device.

20. The display device of claim 19, wherein the subset of the display elements surrounds a subset of the spacers in the plan view of the display device.

* * * * *